(12) United States Patent
Jain

(10) Patent No.: US 8,143,158 B2
(45) Date of Patent: Mar. 27, 2012

(54) METHOD AND DEVICE OF PREVENTING DELAMINATION OF SEMICONDUCTOR LAYERS

(75) Inventor: Ajay Jain, Milpitas, CA (US)

(73) Assignee: Intel Corporation, Santa Clara, CA (US)

( * ) Notice: Subject to any disclaimer, the term of this patent is extended or adjusted under 35 U.S.C. 154(b) by 679 days.

(21) Appl. No.: 12/240,751

(22) Filed: Sep. 29, 2008

(65) Prior Publication Data

US 2010/0276788 A1 Nov. 4, 2010

(51) Int. Cl.
*H01L 21/44* (2006.01)
(52) U.S. Cl. ......... 438/657; 438/612; 438/613; 438/614
(58) Field of Classification Search .................. 438/612, 438/613, 614, 657
See application file for complete search history.

(56) References Cited

U.S. PATENT DOCUMENTS

| 6,638,847 B1* | 10/2003 | Cheung et al. ............... 438/612 |
| 2003/0203614 A1* | 10/2003 | Rajagopalan et al. ........ 438/622 |
| 2005/0070085 A1* | 3/2005 | Huang et al. .................. 438/614 |
| 2006/0057836 A1* | 3/2006 | Nagarajan et al. ............ 438/622 |

* cited by examiner

*Primary Examiner* — Zandra Smith
*Assistant Examiner* — Christy Novacek
(74) *Attorney, Agent, or Firm* — Blakely, Sokoloff, Taylor & Zafman LLP

(57) ABSTRACT

Embodiments of the present invention describe a method and device of preventing delamination of semiconductor layers in a semiconductor device. The semiconductor device comprises a substrate with an interlayer dielectric (ILD). A protection layer is deposited on the ILD. Next, a getter layer is formed on the protection layer to remove any native oxides on the protection layer. A capping layer is then deposited on the getter layer to prevent oxidation of the getter layer. Next, a semiconductor layer is formed on the capping layer. An oxide layer is then deposited on the semiconductor layer. Subsequently, a buffered oxide etch solution is used to remove the oxide layer. By removing the native oxides on the protection layer, the getter layer prevents the reaction between the buffered oxide etch solution and the native oxides which may cause delamination of the semiconductor layer and protection layer.

10 Claims, 10 Drawing Sheets

METHOD AND DEVICE OF PREVENTING DELAMINATION OF SEMICONDUCTOR LAYERS

BACKGROUND OF THE INVENTION

1. Field of the Invention

The present invention relates to the field of semiconductor processing and more particularly to a method of preventing delamination of semiconductor layers in a semiconductor device such as a micro-electro-mechanical system (MEMS) device.

2. Discussion of Related Art

Micro-Electro-Mechanical System (MEMS) applications involve the integration of mechanical structures and electronic components on a common silicon wafer or substrate. One particular type of MEMS application is a solid-state memory device that comprises a media substrate bonded to a CMOS substrate. The CMOS substrate consists of an array of MEMS cantilever structures with probe tips that read and write data on the media substrate. The media substrate is made of a phase change or ferroelectric material that can electrically switch between two or more states depending on the amount of electric current received from the probe tip.

Typically, MEMS cantilever structures are fabricated by photolithography and etching of semiconductor, metallic, and insulating layers deposited on the CMOS substrate. The types of materials used for semiconductor layers are usually poly-silicon or silicon-germanium. When depositing semiconductor layers on the CMOS substrate, native oxides tend to form at the interfaces of semiconductor layers. Native oxides refer to silicon oxides that naturally form on the semiconductor layers due to the oxidation of silicon atoms when the CMOS substrate is exposed to oxygen. These native oxides are undesirable because they may react with a buffered oxide etch solution, such as buffered hydrofluoric acid (BHF) solution, and cause delamination of the semiconductor layers. The BHF solution is used to remove gap fill oxide surrounding the semiconductor layers to define the profile of the cantilever structure. This is also known as the cantilever release. Thus, the reaction between the BHF solution and the native oxides may cause delamination of the semiconductor layers. As a result, the entire cantilever structure or some parts of it may lift off from the CMOS substrate.

DETAILED DESCRIPTION OF THE PRESENT INVENTION

A method and device of preventing delamination of semiconductor layers is described. In the following description, numerous specific details are set forth in order to provide a thorough understanding of the present invention. In other instances, well known semiconductor processing techniques and features has not been described in particular detail in order not to unnecessarily obscure the present invention.

Embodiments of the present invention describe a method of preventing delamination of semiconductor layers in a semiconductor device. In an embodiment of the present invention, the semiconductor device comprises a substrate with an interlayer dielectric (ILD). A protection layer is deposited on the ILD. Next, a getter layer is formed on the protection layer to remove any native oxides on the protection layer. A capping layer is then deposited on the getter layer to prevent oxidation of the getter layer. Next, a semiconductor layer is formed on the capping layer. An oxide layer is then deposited on the semiconductor layer. Subsequently, a buffered oxide etch solution is used to remove the oxide layer. By removing the native oxides on the protection layer, the getter layer prevents the reaction between the buffered oxide etch solution and the native oxides which may cause delamination of the semiconductor layer and protection layer.

Figure 1:
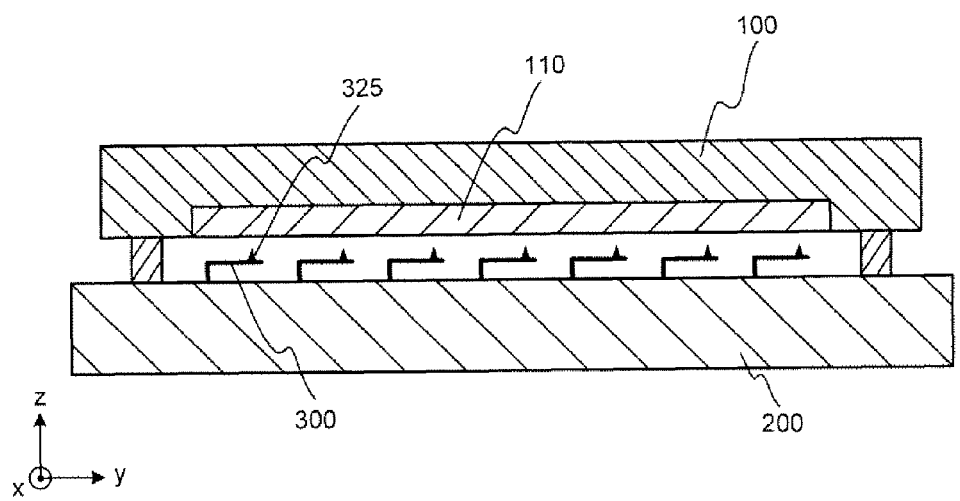
FIG. 1 is a cross-sectional view that illustrates a MEMS memory device in accordance with one embodiment of the present invention.

In an embodiment of the present invention, the semiconductor device as shown in FIG. 1 comprises a media substrate 100 coupled to a CMOS substrate 200. In one embodiment, the semiconductor device is a Micro-Electro-Mechanical System (MEMS) memory device. CMOS substrate 200 comprises a plurality of cantilever structures 300 that are movable in x, y and z directions. Each cantilever 300 comprises a probe tip 325. When the probe tip 325 comes into contact with the memory medium 110 on the media substrate 100, it passes an electric current to the memory medium to either sense or change the state of the memory medium 110. In other words, the probe tip can either read or write data on the memory medium 110. In one embodiment, the memory medium 110 is made of a phase change material that can electrically switch between two or more states depending on the amount of electric current received from the probe tip 325. In a specific embodiment, the memory medium 110 is made of ferromagnetic materials.

Figure 2:
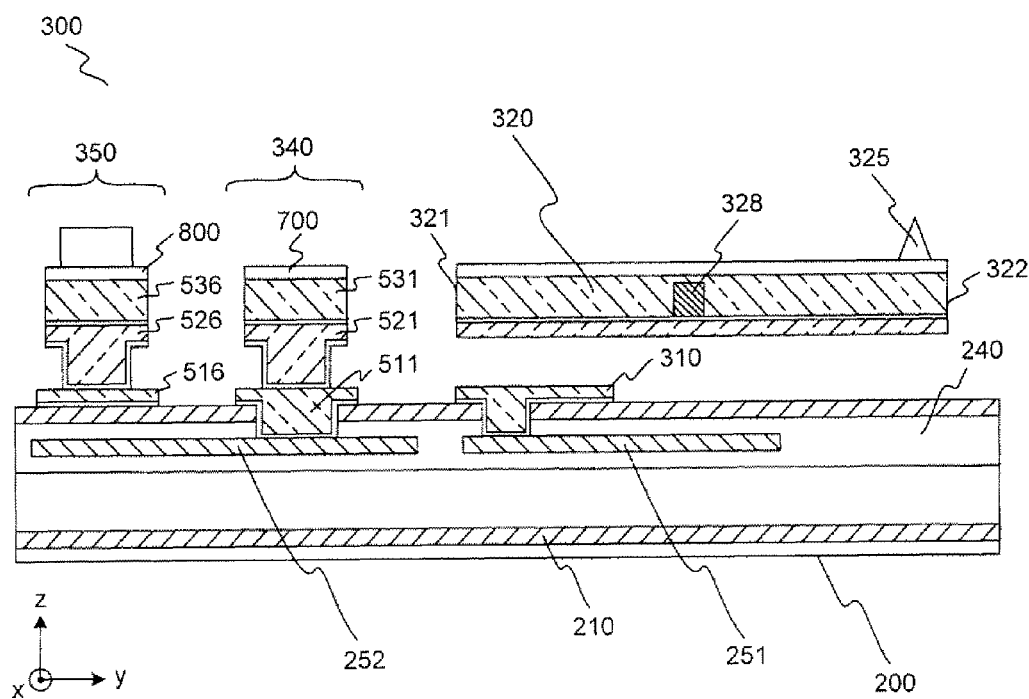
FIG. 2 is a cross-sectional view that illustrates a cantilever structure in accordance with one embodiment of the present invention.

FIG. 2 illustrates the cross-sectional view of the cantilever structure 300 described in FIG. 1. In an embodiment of the present invention, the cantilever structure 300 comprises a cantilever beam 320 disposed above an electrode 310 formed on the CMOS substrate 200. In one embodiment, the CMOS substrate 200 comprises a layer of active devices 210 and multiple interlayer dielectrics (ILD) formed on the layer of active devices 210. For simplicity purposes, only the topmost ILD 240 of the CMOS substrate 200 is illustrated in FIG. 2. Layer of actives devices 210 refers to components such as transistors, rectifiers, and capacitors that form the integrated circuit in the CMOS substrate 200. The topmost ILD 240 includes metal layers 251, 252 that are electrically coupled (not shown) to the layer of active devices 210. Metal layers 251, 252 are made from materials such as but not limited to copper or aluminum.

In one embodiment, the electrode 310 is electrically coupled to metal layer 251. In an embodiment of the present invention, the cantilever beam 320 includes a first end 321 and a second end 322. The first end 321 of the cantilever beam 320 is disposed above the electrode 310. The probe tip 325 is formed adjacent to the second end 322 of the cantilever beam 320. Cantilever beam 320 is supported by a torsion beam 328 that acts as the fulcrum for the cantilever beam 320. In one embodiment, the torsion beam 328 is an elongated member having a length extending along the x-axis. During operation, the electrostatic attraction between the electrode 310 and the first end 321 causes the cantilever beam 320 to flex in z-directions relative to the torsion beam 328. As a result, the probe tip 325 either moves up to contact the memory medium 110 or moves down to break contact from the memory medium 110.

In an embodiment of the present invention, the cantilever structure 300 further comprises an input/output (I/O) structure 340 and a bond ring structure 350. The I/O structure 340 is electrically coupled (not shown) to the cantilever beam 320 to either transmit data signals to the probe tip 325 or receive data signals from the probe tip 325. In one embodiment, the bond ring structure 350 is coupled to the media substrate 100 via an encapsulant (not shown) so as to hermetically seal the cantilever structure 300 between the CMOS substrate 200 and media substrate 100.

Figure 3A:
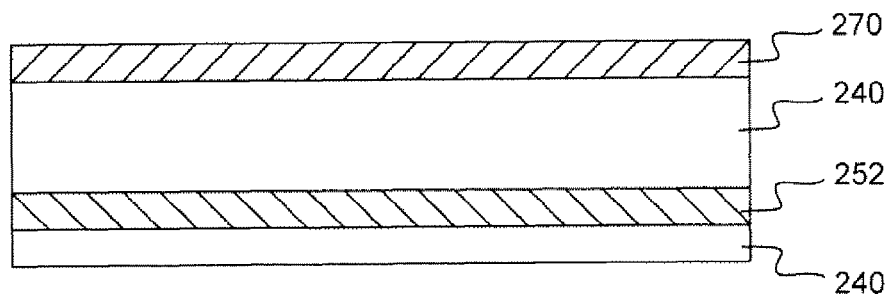
FIGS. 3A-3N are cross-sectional views that illustrate the method of forming an input/output (I/O) structure in accordance with one embodiment of the present invention.
Figure 3B:
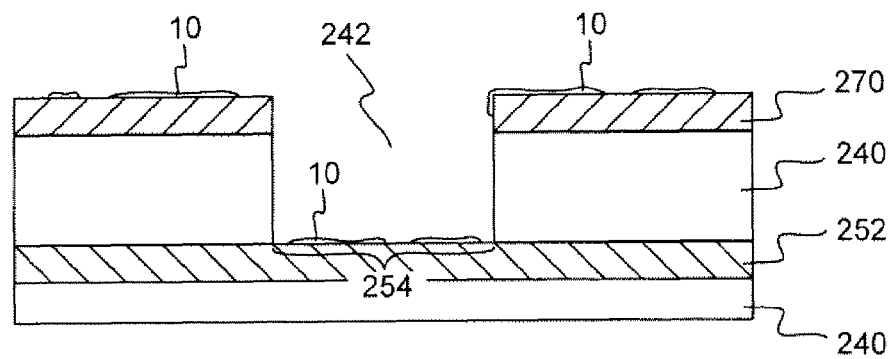
Figure 3C:
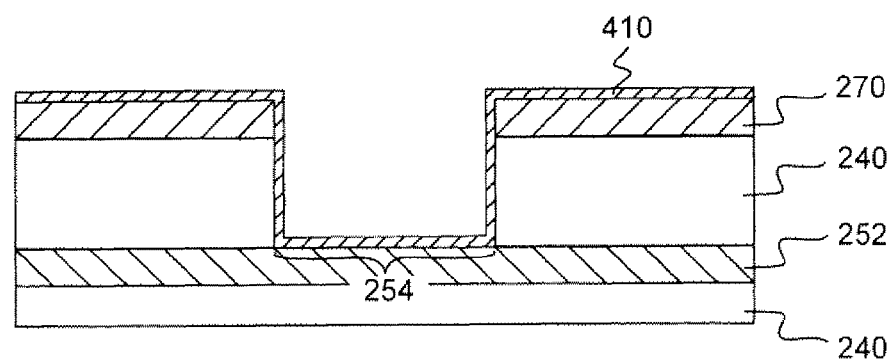
Figure 3D:
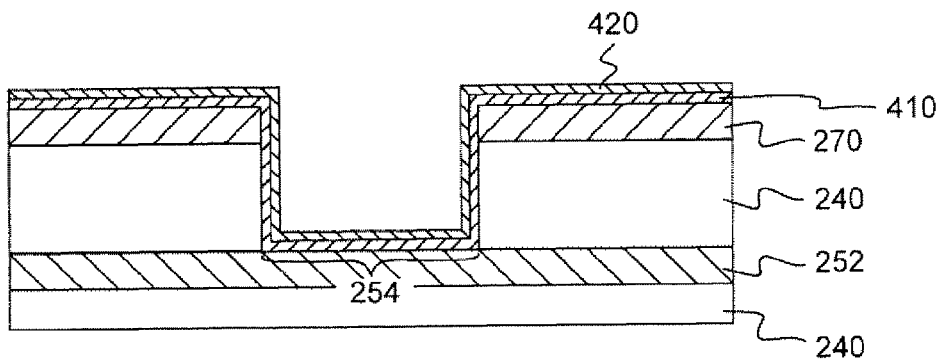
Figure 3E:
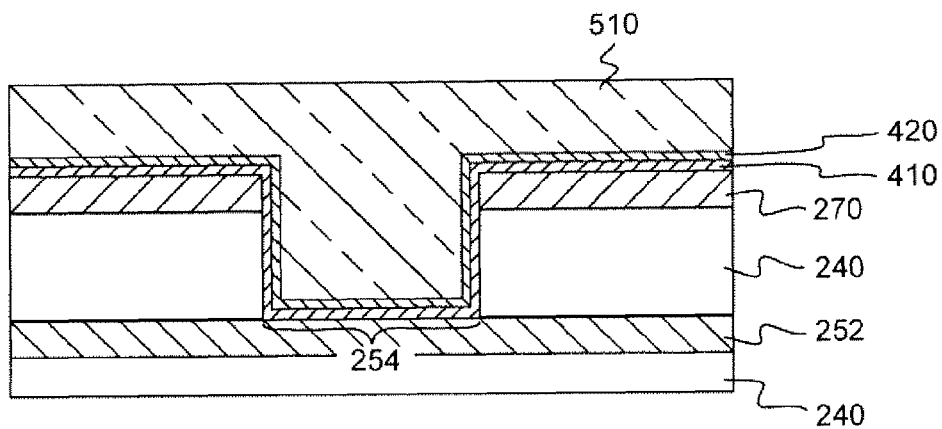
Figure 3F:
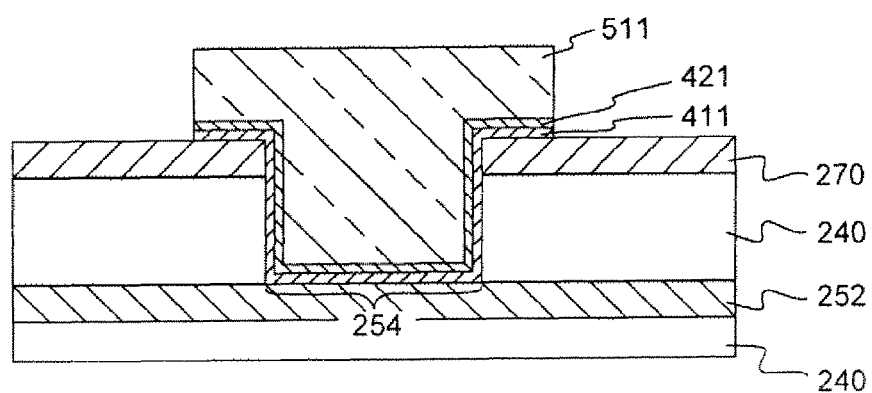
Figure 3G:
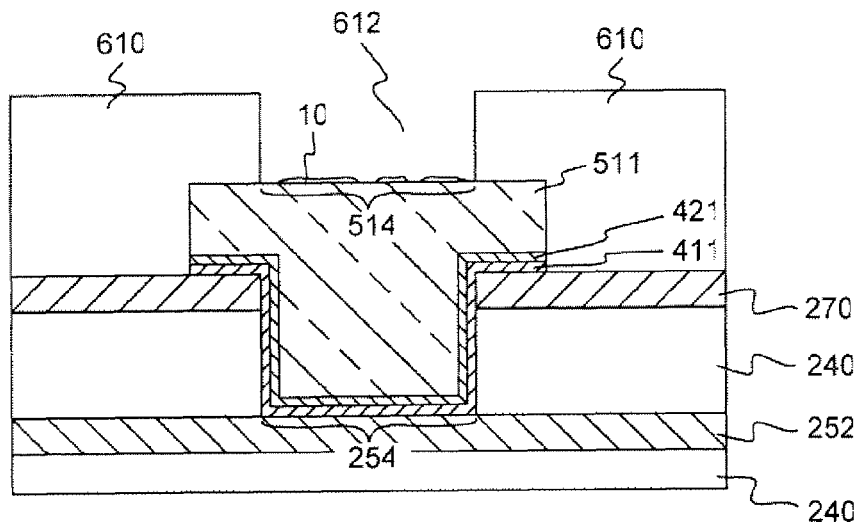
Figure 3H:
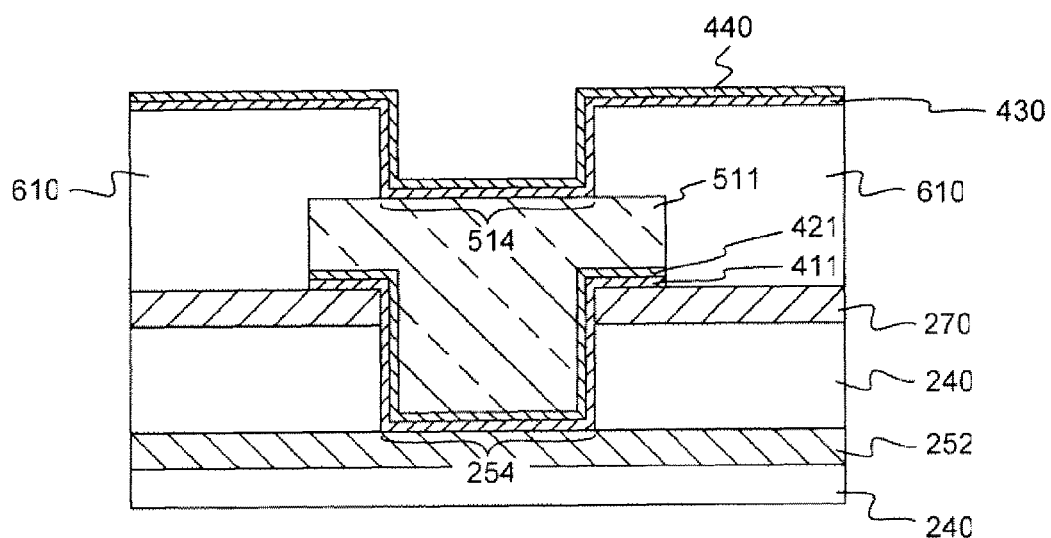
Figure 3I:
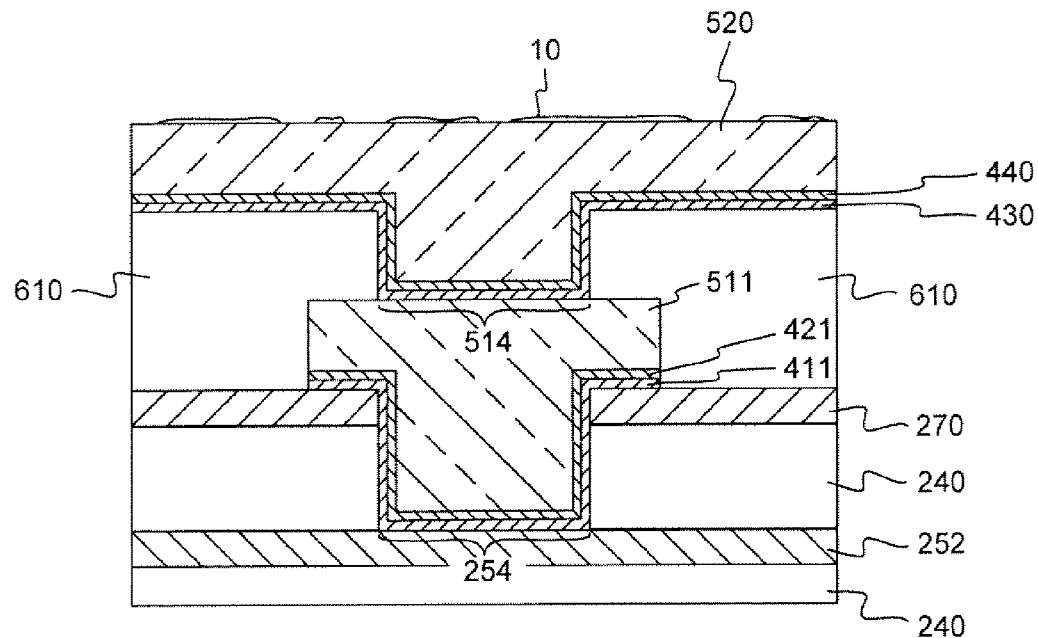
Figure 3J:
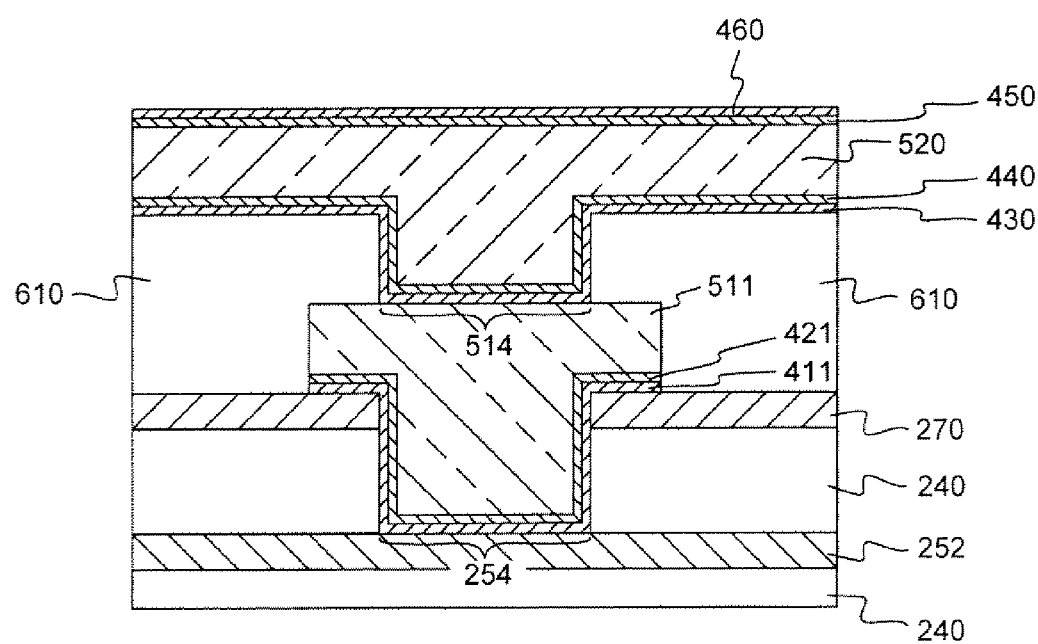
Figure 3K:
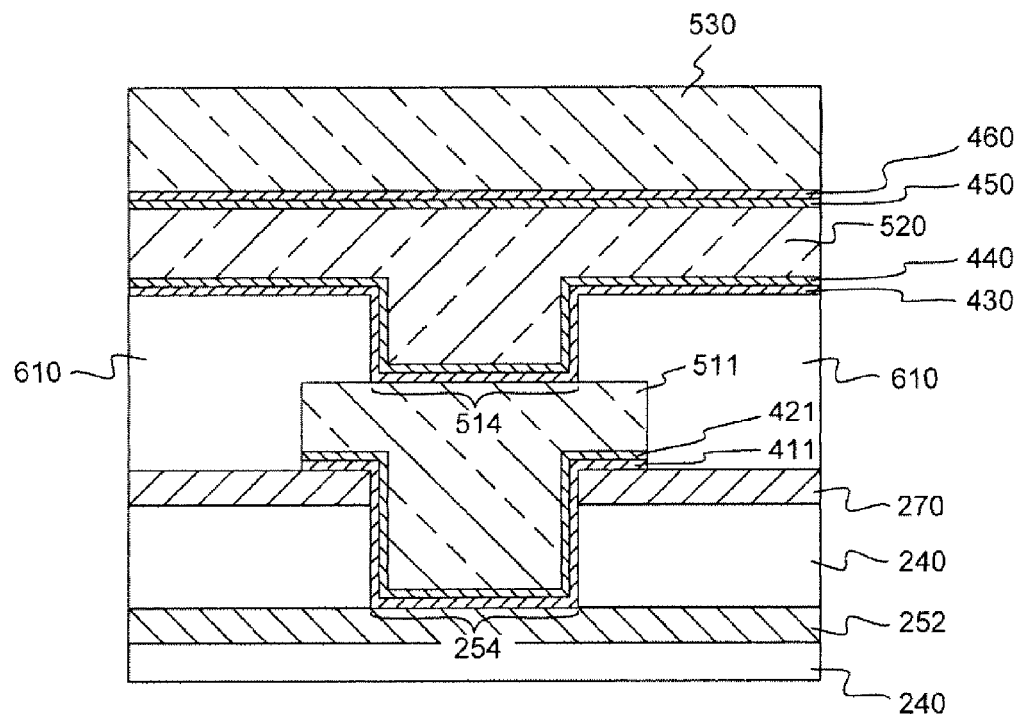
Figure 3L:
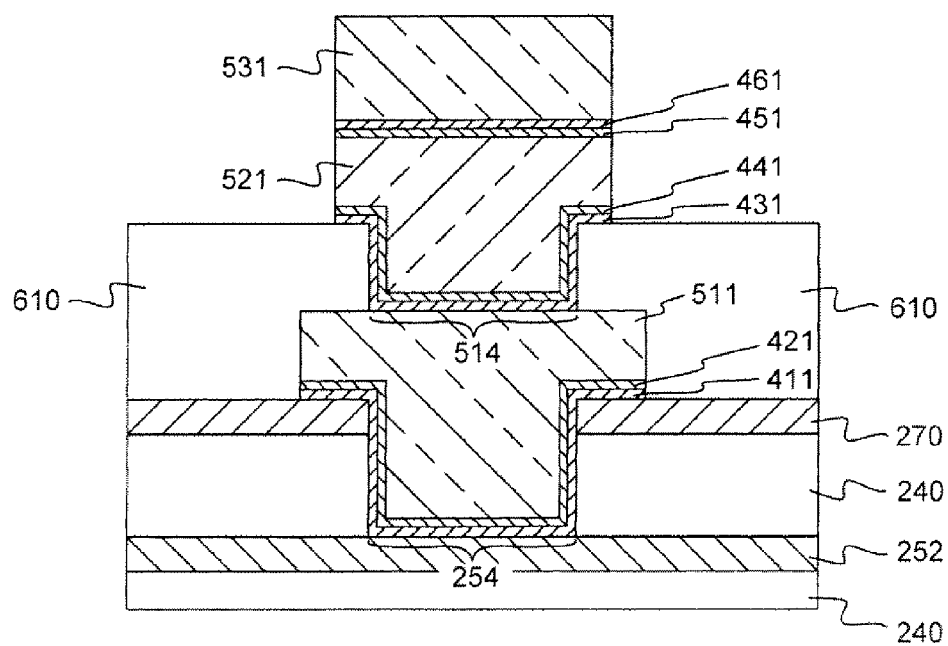
Figure 3M:
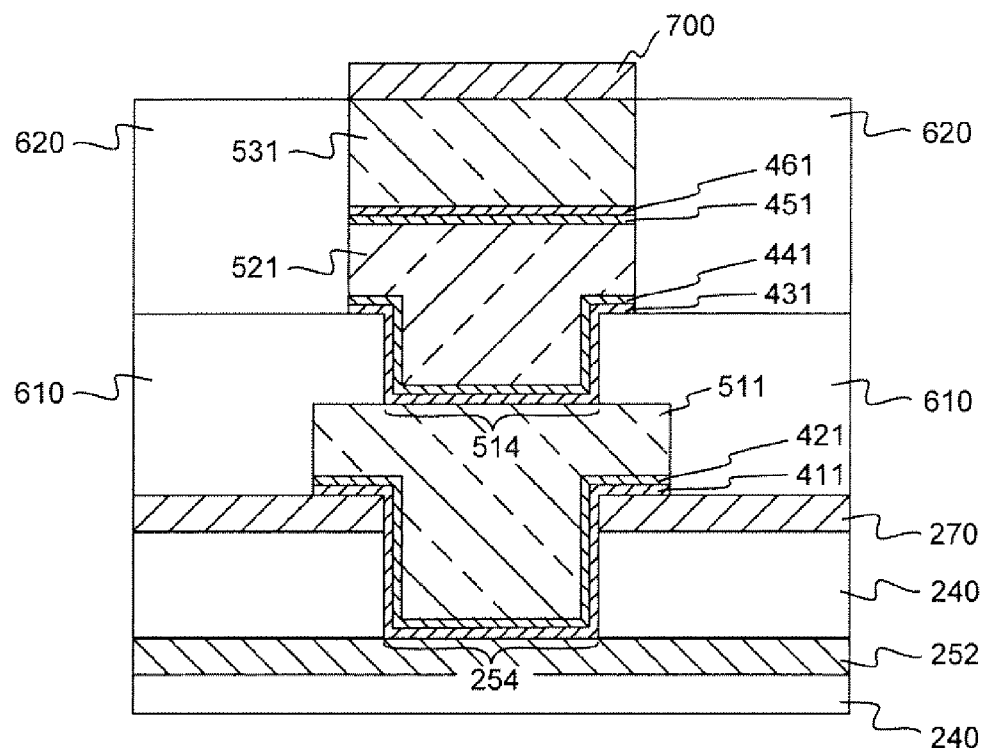
Figure 3N:
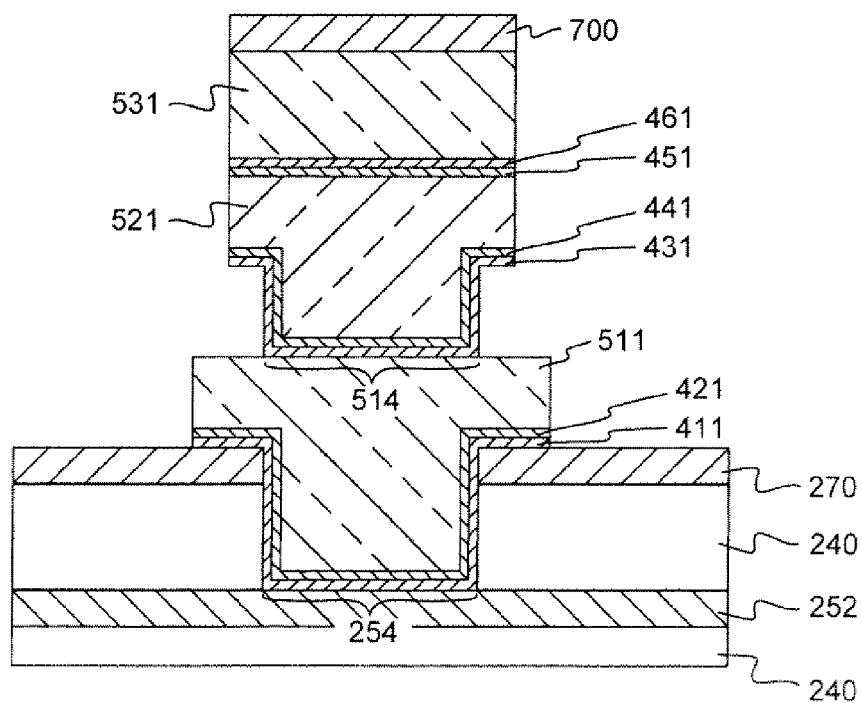

FIGS. 3A-3N illustrate a method of forming the I/O structure 340 in accordance with one embodiment of the present invention. The fabrication of the I/O structure 340 begins, in FIG. 3A, by depositing a protection layer 270 onto the topmost ILD 240 having metal layer 252. In one embodiment, the ILD 240 is made of an oxide material such as but not limited to silicon dioxide ($SiO_2$). In one embodiment, the protection layer 270 is made of a material that has the capability to protect the underlying ILD 240 or CMOS substrate 200 from chemicals during subsequent processes. In a specific embodiment, the protection layer 270 is made of silicon carbide (SiC). In one embodiment, thickness of the silicon carbide deposited is about 300 nm to 500 nm. Protection layer 270 can be deposited on the ILD using well known techniques such as but not limited to chemical vapor deposition (CVD) or physical vapor deposition (PVD).

Next, a via or opening 242 is formed on the ILD 240 to expose a portion 254 of the metal layer 252. As illustrated in FIG. 3B, the via 242 extends from the top of the protection layer 270 to the metal layer 252. Via 242 is formed using well known photolithography and etching techniques.

After the via 242 is formed, impurities such as native oxides 10 may form on the protection layer 270 and exposed portion 254 of metal layer 252. In this case, native oxides 10 refer to silicon oxides that naturally form on the protection layer 270 and exposed portion 254 due to the oxidation of silicon atoms when the CMOS substrate 200 is exposed to air or oxygen. The presence of native oxides 10 on the metal layer 252 is undesirable because they may cause delamination of subsequent layers formed on the metal layer 252. In order to prevent the problem of delamination, a getter layer is deposited onto the exposed portion 254 and protection layer 270 to remove the native oxides 10.

Referring to FIG. 3C, a first getter layer 410 is blanket deposited onto the protection layer 270 and exposed portion 254 of metal layer 252. The first getter layer 410 is made from a material with the capability to remove any native oxides 10 on the protection layer 270 and exposed portion 254. By removing the native oxides 10, the first getter layer 410 prevents delamination of subsequent layers formed on the exposed portion 254 of metal layer 252. In one embodiment, the first getter layer 410 is a titanium (Ti) layer. The titanium getter layer chemically reacts with the native oxides 10 to break down the native oxides 10 and remove them from the protection layer 270 and exposed portion 254. Furthermore, the titanium getter layer remains as a conductive layer and does not adversely affect the contact resistance between the metal layer 252 and subsequently formed layers.

In an embodiment of the present invention, the first getter layer 410 is deposited using well known techniques such as but not limited to CVD or PVD. In one embodiment, the thickness of the first getter layer 410 deposited is about from 5 nm to 20 nm. In a specific embodiment, the thickness of the first getter layer 410 is 5 nm.

In one embodiment, an optional argon (Ar) sputter process is performed on the protection layer 270 and exposed portion 254 before depositing the first getter layer 410. The Ar sputter process helps to remove any native oxides 10 on the protection layer 270 and exposed portion 254 so as to reduce the contact resistance between the metal layer 252 and the subsequently formed layers.

Next, in FIG. 3D, a first capping layer 420 is blanket deposited onto the first getter layer 410. The first capping layer 420 is made from a material with a capability to prevent oxidation of the first getter layer 410 as well as provide strong adhesion properties. In an embodiment of the present invention, the first capping layer 420 is made from refractory materials such as but not limited to refractory nitrides. In a specific embodiment, the first capping layer 420 is a titanium nitride (TiN) layer.

In the case where the first getter layer 410 is a titanium layer, it may oxidize when exposed to oxygen and becomes titanium oxide. Titanium oxide is undesirable because it acts as an insulator, which increases the contact resistance with subsequent layers. Therefore, the first capping layer 420, such as the titanium nitride layer, is deposited onto the titanium layer to prevent oxidation of the titanium layer.

In an embodiment of the present invention, the first capping layer 420 is deposited using well known techniques such as but not limited to CVD or PVD. The thickness of the first capping layer 420 deposited is about 5 nm to 50 nm. In one embodiment, the thickness of the first capping layer 420 is larger than the thickness of the first getter layer 410. For example, the first capping layer 420 is 10 nm thick and the first getter layer 410 is 5 nm thick.

Next, a first semiconductor layer 510 is blanket deposited onto the first capping layer 420 as shown in FIG. 3E. The first capping layer 420 provides strong adhesion between the first semiconductor layer 510 and the metal layer 252. In one embodiment, the first semiconductor layer 510 is made a material such as but not limited to silicon (Si) and silicon-germanium (SiGe). In a specific embodiment, the first semiconductor 510 is made of poly-SiGe. The first semiconductor layer 510 is deposited using well known techniques such as but not limited to CVD or PVD. In one embodiment, the thickness of the first semiconductor layer 510 deposited is about 500 nm to 700 nm.

Subsequently, the first getter layer 410, first capping layer 420 and first semiconductor layer 510 are patterned to form a processed first getter layer 411, a processed first capping layer 421 and a processed first semiconductor layer 511 as shown in FIG. 3F. In an embodiment of the present invention, the processed first semiconductor layer 511 forms the bottom electrode of the I/O structure 340 as illustrated in FIG. 2. In one embodiment, the first getter layer 410, first capping layer 420 and first semiconductor layer 510 are patterned at the same time using well known photolithography and etching techniques. In one embodiment, the etching technique uses an etchant with a chemistry that etches the first semiconductor layer 510, first capping layer 420 and first getter layer 410 but does not etch the protection layer 270.

Next, in FIG. 3G, a first oxide layer 610 having a via 612 is formed on the processed first semiconductor layer 511. In one embodiment, the first oxide layer 610 is made of a material such as but not limited to silicon dioxide. In one embodiment, the thickness of the first oxide layer 610 deposited is about 3 µm to 4 µm. In an embodiment of the present invention, the first oxide layer 610 is blanket deposited onto the processed first semiconductor layer 511 and protection layer 270 using well known techniques such as but not limited to CVD or PVD. The first oxide layer 610 is then patterned using well known lithography and etching techniques to form via 612, wherein the via 612 exposes a portion 514 of the processed first semiconductor layer 511.

After the via 612 is formed in the first oxide layer 610, native oxides 10 may form on the exposed portion 514 of the processed first semiconductor layer 511. The presence of native oxides 10 on the processed first semiconductor layer 511 is undesirable because they may cause delamination of subsequent semiconductor layers formed on the processed first semiconductor layer 511. In order to prevent delamination, a second getter layer is deposited onto the exposed portion 514 to remove the native oxides 10.

Referring to FIG. 3H, a second getter layer 430 is blanket deposited onto the exposed portion 514 and the first oxide layer 610. Then, a second capping layer 440 is blanket deposited onto the second getter layer 430. The method of fabricating the second getter layer 430 is similar to the method described for the first getter layer 410 in FIG. 3C, and thus will not be described in detail here. Also, the second capping layer 440 is fabricated using similar methods described for the first capping layer 420 in FIG. 3D.

Briefly, the second getter layer 430 chemically reacts with the native oxides 10 on the exposed portion 514 to break down the native oxides 10 and remove them from the exposed portion 514. The second capping layer 440 prevents oxidation of the second getter layer 430. In an embodiment of the present invention, the second getter layer 430 is a titanium layer and the second capping layer 440 is a titanium nitride layer. In one embodiment, thickness of the second getter layer 430 is about 5 nm to 20 nm and thickness of the second capping layer 440 is about 5 nm-50 nm. In a specific embodiment, thickness of the second getter layer 430 is 5 nm and thickness of the second capping layer 440 is 10 nm.

In one embodiment, an optional argon (Ar) sputter process is performed on the exposed portion 514 before depositing the second getter layer 430. The Ar sputter process helps to remove any native oxides 10 on the exposed portion 514.

Next, a second semiconductor layer 520 is blanket deposited onto the second capping layer 440 as shown in FIG. 3I. The second capping layer 440 provides strong adhesion between the second semiconductor layer 520 and the first semiconductor layer 510. In one embodiment, the second semiconductor layer 520 is made a material such as but not limited to silicon (Si) and silicon-germanium (SiGe). In a specific embodiment, the second semiconductor layer 520 is made of poly-SiGe. The second semiconductor layer 520 is deposited using well known techniques such as but not limited to CVD or PVD. In one embodiment, the thickness of the second semiconductor layer 520 deposited is about 0.8 µm to 1.2 µm.

Native oxides 10 may form on the second semiconductor layer 520. Therefore, a third getter layer is formed on the second semiconductor layer 520 to remove any native oxides 10. Referring to FIG. 3J, a third getter layer 450 is blanket deposited onto second semiconductor layer 520. Furthermore, a third capping layer 460 is blanket deposited onto the third getter layer 450. The method of fabricating the third getter layer 450 is similar to the method described for the first getter layer 410 in FIG. 3C, and thus will not be described in detail here. Also, the third capping layer 460 is fabricated using similar methods described for the first capping layer 420 in FIG. 3D.

The third getter layer 450 chemically reacts with the native oxides 10 to break down and remove the native oxides 10 from the second semiconductor layer 520. Furthermore, the third capping layer 460 prevents oxidation of the third getter layer 450. In an embodiment of the present invention, the third getter layer 450 is a titanium layer and the third capping layer 460 is a titanium nitride layer. In one embodiment, the thickness of the third getter layer 450 is about 5 nm to 20 nm and thickness of the third capping layer 460 is about 5 nm-50 nm. In a specific embodiment, thickness of the third getter layer 450 is 5 nm and thickness of the third capping layer 460 is 10 nm.

In one embodiment, an optional argon (Ar) sputter process is performed on the second semiconductor layer 520 before depositing the third getter layer 450. The Ar sputter process helps to remove any native oxides 10 on the second semiconductor layer 520.

Next, a third semiconductor layer 530 is blanket deposited onto the third capping layer 460 as shown in FIG. 3K. The third capping layer 460 provides strong adhesion between the third semiconductor layer 530 and the second semiconductor layer 520. In one embodiment, the third semiconductor layer 530 is made a material such as but not limited to silicon (Si) and silicon-germanium (SiGe). In a specific embodiment, the third semiconductor layer 530 is made of poly-SiGe. The third semiconductor layer 530 is deposited using well known techniques such as but not limited to CVD or PVD. In one embodiment, the thickness of the third semiconductor layer 530 is larger than the second semiconductor layer 520. In a specific embodiment, the thickness of the third semiconductor layer 530 is about 1.8 to 2.2 µm.

Next, the third getter layer 450, third capping layer 460 and third semiconductor layer 530 are patterned to form a processed third getter layer 451, a processed third capping layer 461 and a processed third semiconductor layer 531, as shown in FIG. 3L. At the same time, the second getter layer 430, second capping layer 440 and second semiconductor layer 520 are patterned to form a processed second getter layer 431, a processed second capping layer 411 and a processed second semiconductor layer 521. In an embodiment of the present invention, the processed second semiconductor layer 521 and processed third semiconductor layer 531 form the body of the I/O structure 340 as illustrated in FIG. 2.

In one embodiment, the second and third getter layers 430, 450, second and third capping layer 440, 460, and second and third semiconductor layers 520, 530 are patterned using well known photolithography and etching techniques. In one embodiment, the etching uses an etchant with a chemistry that etches the second and third getter layers 430, 450, second and third capping layer 440, 460, and second and third semiconductor layers 520, 530 but does not etch the first oxide layer 610.

Referring to FIG. 3M, a second oxide layer 620 is formed on the first oxide layer 610 and the second and third processed semiconductor layers 521, 531. In one embodiment, the second oxide layer 620 is made of a material such as but not limited to silicon dioxide. In an embodiment of the present invention, the second oxide layer 620 is blanket deposited onto the first oxide layer 610 and the second and third processed semiconductor layers 521, 531 using well known techniques such as but not limited to CVD or PVD. Then, the second oxide layer 620 is planarized until its top surface is coplanar to the top of the third processed semiconductor layer 531.

Subsequently, a conductive layer 700 can be formed on top of the processed third semiconductor layer 531. In an embodiment of the present invention, the conductive layer 700 is a trace metal, as shown in FIG. 2, that electrically couples the I/O structure 340 to the probe tip 325 on the cantilever beam 320. In one embodiment, the conductive layer 700 is made of titanium nitride.

Next, the first and second oxide layers 610, 620 are removed as illustrated in FIG. 3N. In an embodiment of the present invention, the first and second oxide layers 610, 620 are removed by using a buffered oxide etch. In one embodiment, the buffered oxide etch process can either be a wet etching process or a vapor etching process. In one embodiment, the buffered oxide etch process uses a buffered hydrofluoric acid (BHF) solution. In one embodiment, the BHF solution comprises hydrofluoric acid (HF), ammonium fluoride ($NH_4F$) and water ($H_2O$). In a specific embodiment, the BHF solution contains about 0.5 to 10 percent by volume hydrofluoric acid, about 30 to 50 percent by volume ammonium fluoride, and about 40 to 70 percent by volume water. The BHF solution selectively etches the first and second oxide layers 610, 620 without etching the other layers of the I/O structure 340. In one embodiment, the buffered oxide etch process used for removing the first and second oxide layers 610, 620 is the same process used for the cantilever release. Cantilever release refers to the process of removing the gap fill oxide to define the profile of the cantilever beam 320.

The BHF chemical solution may react with any native oxides 10 formed between the processed semiconductor layers 511, 521, 531 and causes the entire I/O structure 340, or part of it, to detach from the CMOS substrate 200. Therefore, the present invention utilizes the processed getter layers 411, 431, 451 to remove any native oxides 10 on the processed semiconductor layers 511, 521, 531. For example, the processed first getter layer 411 is formed on the metal layer 252 to remove native oxides 10 thereon and prevents delamination between the metal layer 252 and the processed first semiconductor layer 511. Similarly, processed second getter layer 431 is formed on processed first semiconductor layer 511 to remove native oxides 10 thereon and prevents delamination between processed first semiconductor layer 511 and processed second semiconductor layer 521.

Furthermore, the processed capping layers 421, 441, 461 provide strong adhesion between the processed semiconductor layers 511, 521, 531 to prevent delamination of the processed semiconductor layers 511, 521, 531. For example, processed capping layer 421 provides strong adhesion between metal layer 252 and processed first semiconductor layer 511. Similarly, processed capping layer 431 provides strong adhesion between processed first semiconductor layer 511 and processed second semiconductor layer 521.

FIGS. 4A-4G illustrate a method of forming the bong ring structure 350 as shown in FIG. 2. The fabrication of the bond ring structure 350 begins, in FIG. 4A, by depositing protection layer 270 onto the topmost ILD 240 having metal layer 252. Protection layer 270, ILD 240 and metal layer 252 are similar to earlier embodiments described in relation to FIG. 3A, and thus will not be described in detail here.

After depositing the protection layer 270, impurities such as native oxides 10 may form on the protection layer 270. The presence of native oxides 10 on the protection layer 270 is undesirable because they may cause delamination of subsequent layers formed on top of the protection layer 270. In order to prevent the problem of delamination, a getter layer is deposited onto the protection layer 270 to remove the native oxides 10.

Figure 4A:
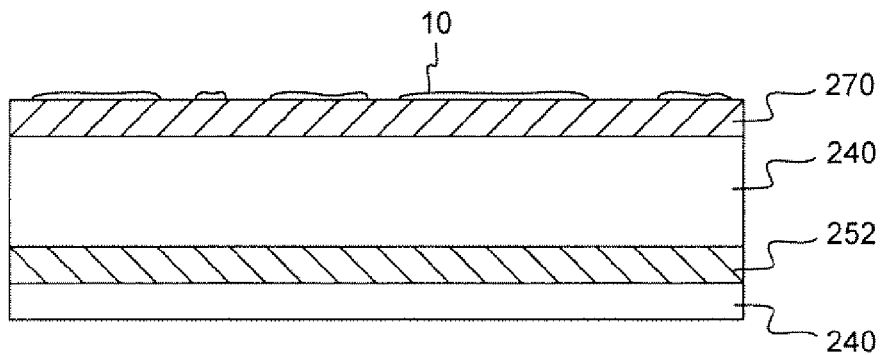
FIGS. 4A-4G are cross-sectional views that illustrate the method of forming a bond ring structure in accordance with one embodiment of the present invention.
Figure 4B:
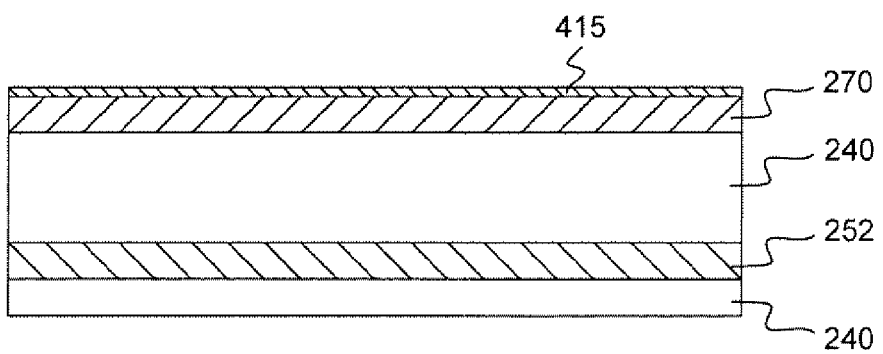

Referring to FIG. 4B, a first getter layer 415 is blanket deposited onto the protection layer 270. The method of fabricating first getter layer 415 and the types of materials used for the first getter layer 415 is similar to previously described embodiments in FIG. 3C and hence will not be described in detail here. In one embodiment, the first getter layer 415 is made from a material with the capability to remove any native oxides 10 on the protection layer 270. In one embodiment, the first getter layer 415 is a titanium (Ti) layer.

In one embodiment, an optional argon (Ar) sputter process is performed on the protection layer 270 before depositing the first getter layer 415. The Ar sputter process helps to remove any native oxides 10 on the protection layer 270.

Figure 4C:
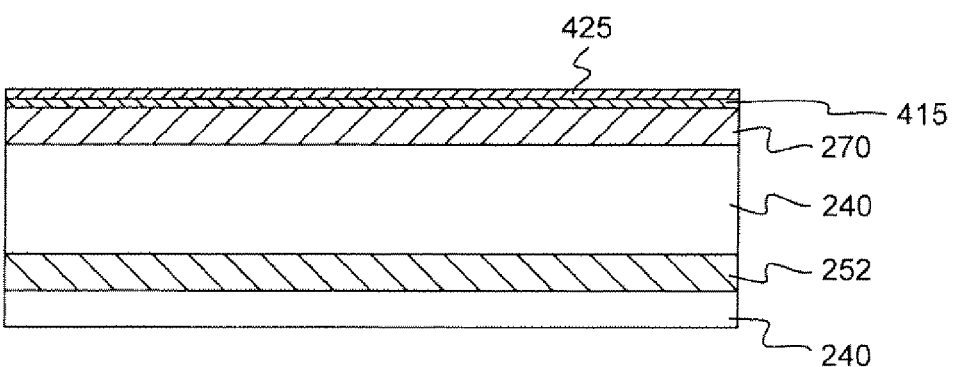

Next, in FIG. 4C, a first capping layer 425 is blanket deposited onto the first getter layer 415. The method of fabricating first capping layer 425 and the types of materials used for the first capping layer 425 is similar to previously described embodiments in FIG. 3D and hence will not be described in detail here. In one embodiment, the first capping layer 425 is made from refractory materials such as but not limited to refractory nitrides. In a specific embodiment, the first capping layer 425 is a titanium nitride (TiN) layer.

Figure 4D:
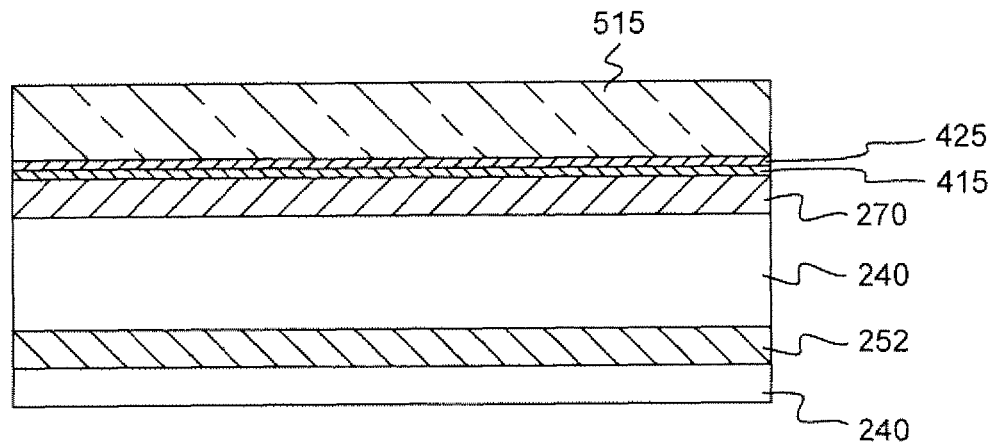

Referring to FIG. 4D, a first semiconductor layer 515 is blanket deposited onto the first capping layer 425. The first capping layer 425 provides strong adhesion between the first semiconductor layer 515 and the protection layer 270. The method of fabricating first semiconductor layer 515 and the types of materials used for the first semiconductor layer 515 is similar to previously described embodiments in FIG. 3E and hence will not be described in detail here. In one embodiment, the first semiconductor layer 515 is made a material such as but not limited to silicon (Si) and silicon-germanium (SiGe). In a specific embodiment, the first semiconductor 510 is made of poly-SiGe.

Figure 4E:
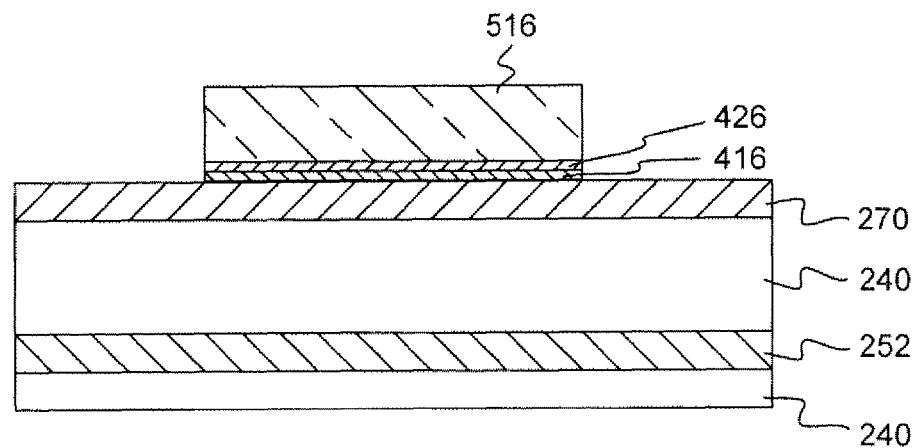

Next, the first getter layer 415, first capping layer 425 and first semiconductor layer 515 are patterned to form a processed first getter layer 416, a processed first capping layer 426 and a processed first semiconductor layer 516 as shown in FIG. 4E. In one embodiment, the first getter layer 415, first capping layer 425 and first semiconductor layer 515 are patterned at the same time using well known photolithography and etching techniques. In one embodiment, the etching technique uses an etchant with a chemistry that etches the first semiconductor layer 515, first capping layer 425 and first getter layer 415 but does not etch the protection layer 270.

Figure 4F:
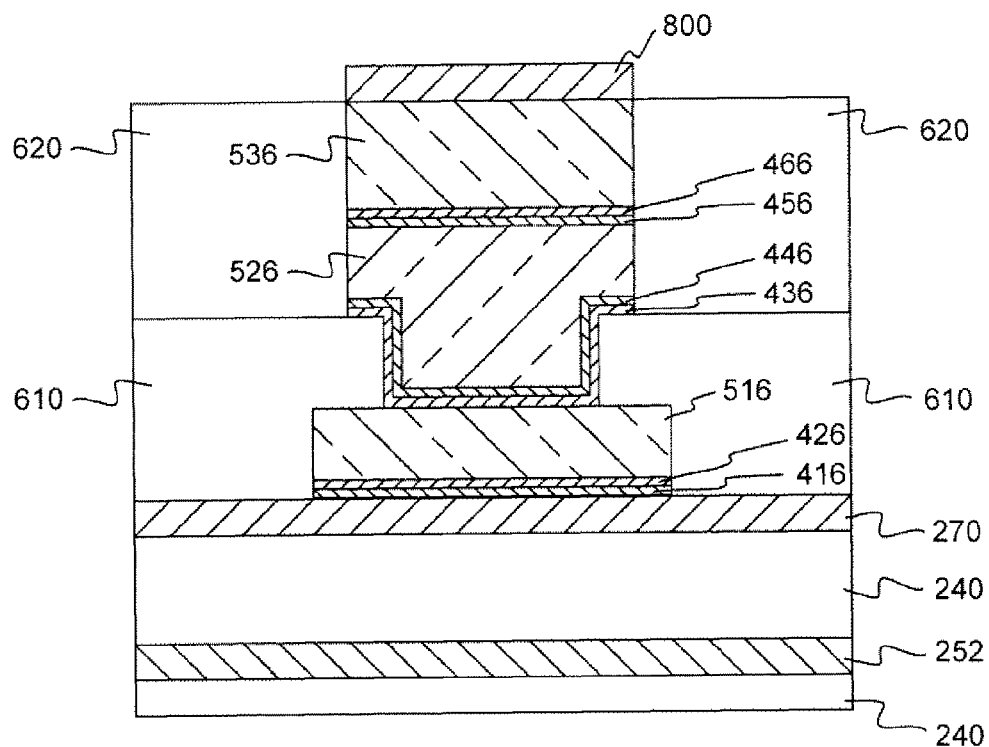

Subsequently, in FIG. 4F, processed second getter layer 436, processed second capping layer 446 and processed second semiconductor layer 526 are formed on the processed first semiconductor layer 516 using the same methods described in FIGS. 3G-3M. Furthermore, using the same methods in FIGS. 3G-3M, processed third getter layer 456, processed third capping layer 466 and processed third semiconductor layer 536 are formed on the processed second semiconductor layer 526. In an embodiment of the present invention, the processed first, second and third semiconductor layers 516, 526, 536 form the body of the bond ring structure 350 as illustrated in FIG. 2.

In one embodiment, a protection layer 800 can be formed on top of the processed third semiconductor layer 536. In an embodiment of the present invention, the protection layer 800 is made of silicon carbide.

Figure 4G:
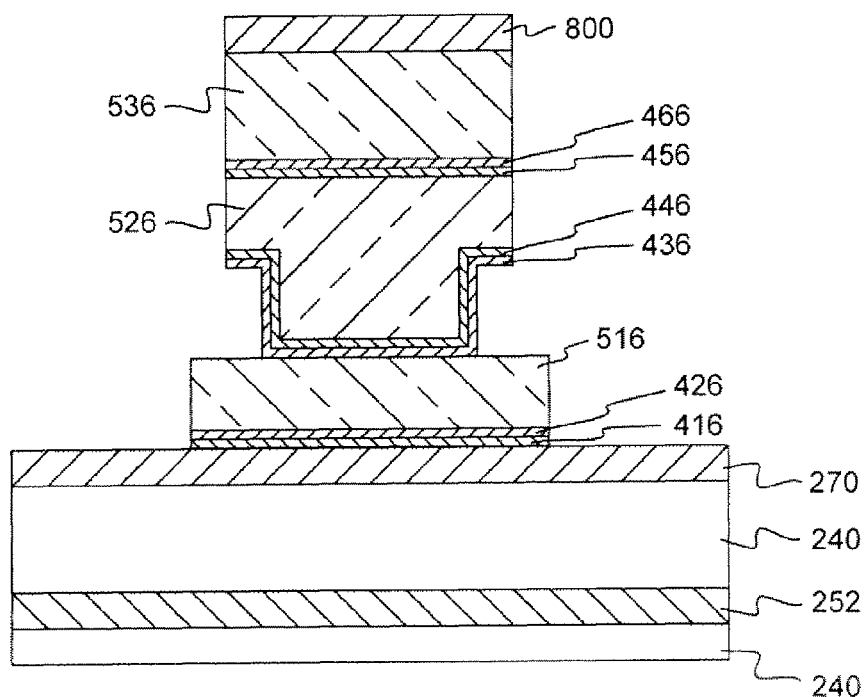

Next, the first and second oxide layers 610, 620 are removed as illustrated in FIG. 4G. The first and second oxide layers 610, 620 can be removed by using the same buffered oxide etch process described in relation to FIG. 3N. In one embodiment, the buffered oxide etch process can either be a wet etching process or a vapor etching process. In one embodiment, the buffered oxide etch process uses a buffered hydrofluoric acid (BHF) solution. In one embodiment, the BHF solution comprises hydrofluoric acid (HF), ammonium fluoride ($NH_4F$) and water ($H_2O$). In a specific embodiment, the BHF solution contains about 0.5 to 10 percent by volume hydrofluoric acid, about 30 to 50 percent by volume ammonium fluoride, and about 40 to 70 percent by volume water. In one embodiment, the BHF selectively etches the first and second oxide layers 610, 620 without etching the other layers.

The BHF solution may react with any native oxides 10 formed between the processed semiconductor layers 516, 526, 536 and cause the entire or part of the bond ring structure 350 to detach from the CMOS substrate 200. Therefore, the present invention utilizes the processed getter layers 416, 436, 456 to remove any native oxides 10 between the processed semiconductor layers 516, 526, 536. For example, the processed first getter layer 416 is formed on the protection layer 270 to remove native oxides 10 thereon and prevents delamination between the protection layer 270 and the processed first semiconductor layer 516. Similarly, processed second getter layer 436 is formed on processed first semiconductor layer 516 to remove native oxides 10 thereon and prevents delamination between processed first semiconductor layer 516 and processed second semiconductor layer 526.

Furthermore, the processed capping layers 426, 446, 466 provide strong adhesion between the processed semiconductor layers 516, 526, 536 to prevent delamination of the processed semiconductor layers 516, 526, 536. For example, processed capping layer 426 provides strong adhesion between protection layer 270 and processed first semiconductor layer 516. Similarly, processed capping layer 436 provides strong adhesion between processed first semiconductor layer 516 and processed second semiconductor layer 526.

Several embodiments of the invention have thus been described. However, those ordinarily skilled in the art will recognize that the invention is not limited to the embodiments described, but can be practiced with modification and alteration within the spirit and scope of the appended claims that follow.

I claim:

1. A method of forming a semiconductor device comprising:
   depositing a protection layer on a topmost interlayer dielectric of a substrate;
   forming a first getter layer onto the protection layer to remove native oxides from the protection layer;
   forming a first capping layer onto the first getter layer to prevent oxidation of the first getter layer;
   forming a first semiconductor layer onto the first capping layer;
   depositing an oxide layer on the first semiconductor layer, the oxide layer having a via that exposes a portion of the first semiconductor layer;
   forming a second getter layer onto the exposed portion of first semiconductor layer to remove native oxides from the exposed portion;
   forming a second capping layer on the second getter layer to prevent oxidation of the second getter layer;
   forming a second semiconductor layer on the second capping layer; and
   removing the oxide layer by a buffered oxide etch process.

2. The method of claim 1, wherein the buffered oxide etch process utilizes a chemical solution comprising hydrofluoric acid (HF) ammonium fluoride (NH4F) and water (H2O).

3. The method of claim 1, further comprising:
   performing a sputter process on the protection layer before forming the first getter layer on the protection layer, wherein the sputter process removes native oxides from the protection layer.

4. The method of claim 1, wherein the first getter layer is a titanium layer and the first capping layer is a titanium nitride layer.

5. The method of claim 1, wherein the second getter layer is a titanium layer and the second capping layer is a titanium nitride layer.

6. A method of forming a semiconductor device comprising:
   depositing a protection layer on a topmost interlayer dielectric of a substrate, the topmost interlayer dielectric having a metal layer;
   forming a via in the protection layer and topmost interlayer dielectric to expose a portion on the metal layer;
   forming a first getter layer onto the protection layer and the exposed portion on metal layer to remove native oxides from the protection layer and exposed portion on metal layer;
   forming a first capping layer onto the first getter layer to prevent oxidation of the first getter layer;
   forming a first semiconductor layer onto the first capping layer;
   depositing an oxide layer on the first semiconductor layer, the oxide layer having a via that exposes a portion of the first semiconductor layer;
   forming a second getter layer onto the exposed portion of first semiconductor layer to remove native oxides from the exposed portion of first semiconductor layer;
   forming a second capping layer on the second getter layer to prevent oxidation of the second getter layer;
   forming a second semiconductor layer on the second capping layer; and
   removing the oxide layer by a buffered oxide etch process.

7. The method of claim 6, wherein the buffered oxide etch process utilizes a chemical solution comprising hydrofluoric acid (HF) ammonium fluoride (NH4F) and water (H2O).

8. The method of claim 6, further comprising:
   performing a sputter process on both the protection layer and exposed portion of metal layer before forming the first getter layer on the protection layer and exposed portion of metal layer, wherein the sputter process removes native oxides from the protection layer and exposed portion of metal layer.

9. The method of claim 6, wherein the first getter layer is a titanium layer and the first capping layer is a titanium nitride layer.

10. The method of claim 6, wherein the second getter layer is a titanium layer and the second capping layer is a titanium nitride layer.

* * * * *